United States Patent [19]

Ong et al.

[11] Patent Number: 5,645,900
[45] Date of Patent: Jul. 8, 1997

[54] DIAMOND COMPOSITE FILMS FOR PROTECTIVE COATINGS ON METALS AND METHOD OF FORMATION

[75] Inventors: Tiong P. Ong, Austin, Tex.; Yuh-han Shing, Hsinchu, Taiwan

[73] Assignee: The United States of America as represented by the Administrator of the National Aeronautics and Space Administration, Washington, D.C.

[21] Appl. No.: 328,947

[22] Filed: Oct. 25, 1994

Related U.S. Application Data

[63] Continuation of Ser. No. 52,419, Apr. 22, 1993, abandoned.

[51] Int. Cl.⁶ .................. H05H 1/02; C23C 16/32; C23C 16/42
[52] U.S. Cl. .................. 427/571; 427/573; 427/574; 427/577; 427/255.7
[58] Field of Search .................. 427/571, 574, 427/577, 578, 255.7

[56] References Cited

U.S. PATENT DOCUMENTS

| | | |
|---|---|---|
| 4,486,286 | 12/1984 | Lewin . |
| 4,647,494 | 3/1987 | Meyerson et al. ............ 427/577 |
| 4,842,945 | 6/1989 | Ito . |
| 4,957,591 | 9/1990 | Sato . |
| 5,006,203 | 4/1991 | Purdes . |
| 5,124,179 | 6/1992 | Garg et al. ............ 427/249 |
| 5,147,687 | 9/1992 | Garg et al. ............ 427/249 |
| 5,169,676 | 12/1992 | Moran et al. ............ 427/575 |
| 5,185,179 | 2/1993 | Yamazaki et al. ............ 427/577 |
| 5,200,231 | 4/1993 | Bachmann et al. ............ 427/249 |
| 5,242,711 | 9/1993 | De Natale et al. ............ 427/249 |
| 5,260,107 | 11/1993 | Kawamura et al. ............ 427/577 |

OTHER PUBLICATIONS

Flexible Diamond Composite Films for Sheet MetalCoating Applications, by T.P. Ong et al., published in the Proceedings of the Second International Conference on the New Diamond Science and Technology, Washington, DC, Sep. 1990.

Ong, T.P. et al. Properties of Diamond Composite Films Grown on Iron Surfaces; Appl Phys Lett 58 (4) 28 Jan. 1991 pp. 358–360.

*Primary Examiner*—Shrive Beck
*Assistant Examiner*—Bret Chen
*Attorney, Agent, or Firm*—John H. Kusmiss

[57] ABSTRACT

Composite films consisting of diamond crystallites and hard amorphous films such as diamond-like carbon, titanium nitride, and titanium oxide are provided as protective coatings for metal substrates against extremely harsh environments. A composite layer having diamond crystallites and a hard amorphous film is affixed to a metal substrate via an interlayer including a bottom metal silicide film and a top silicon carbide film. The interlayer is formed either by depositing metal silicide and silicon carbide directly onto the metal substrate, or by first depositing an amorphous silicon film, then allowing top and bottom portions of the amorphous silicon to react during deposition of the diamond crystallites, to yield the desired interlayer structure.

4 Claims, 4 Drawing Sheets

DIAMOND COMPOSITE FILMS FOR PROTECTIVE COATINGS ON METALS AND METHOD OF FORMATION

This application is a continuation of application Ser. No. 08/052,419, filed Apr. 22, 1993, now abandoned.

ORIGIN OF THE INVENTION

The invention described herein was made in the performance of work under a NASA contract, and is subject to the provisions of Public Law 96-517 (35 U.S.C. Section 202) in which the Contractor has elected not to retain title.

TECHNICAL FIELD

The invention generally relates to composite films including diamond and hard amorphous films.

BACKGROUND ART

Metals such as advanced superalloy materials have been used in a wide variety of applications including turbine engines, bearings, gears, etc. Frequently, the materials are constantly employed under severe environmental and mechanical conditions, resulting in an accelerated degradation of the performance of the materials. Corrosion and wear problems have been widely recognized as a main cause in reducing the lifetime of the material. Robust coatings which are thermally, chemically, and mechanically stable on metals have not been effectively provided heretofore.

Diamonds are known to have chemical inertness, extreme mechanical hardness, and the highest thermal conductivity of all solid materials. Currently, polycrystalline diamond thin films can be easily deposited using a chemical vapor deposition (CVD) technique. However, diamond film deposition on metal surfaces is not an easy, and sometimes not an appropriate task to do, for several reasons, which follow.

Differences in thermal properties between the substrate and the deposited film can introduce severe stress at the film substrate interface. The thermal expansion coefficients of most metals far exceed that of diamond over a wide range of temperatures, thus giving rise to spontaneous spallation failure between the film and the substrate. Polycrystalline diamond films by themselves are not suitable, particularly in the applications which involve heavy thermal cycling.

Metals such as iron, cobalt, nickel, or platinum are known for their catalytic effects. These elements have the tendency to form coke deposits from gases containing carbon at elevated temperatures. The coke deposits range in structure from polycyclic aromatic rings to disordered carbon, usually in the form of laminar graphite, nonoriented carbon, and fibrous carbon films. These undesired deposits significantly affect the nucleation of diamond particles on such metals. Thus far no satisfactory explanation has been given to account for the catalytic effect, although it has been speculated that the catalytic effect might be due to the high electron affinity which originates from an unfilled d-band electron shell in the metals. Moreover, the rate of carbon diffusion in metals such as iron is high enough that the carbon species from the diamond forming plasma environment are consumed significantly by the materials.

From the foregoing, it can be appreciated that there is a need to provide an improved diamond or diamond-like film for coating metals.

STATEMENT OF THE INVENTION

The objects of the invention are achieved by the provision of a composite structure formed on a metal substrate, comprising a metal silicide interlayer formed on the metal substrate, a silicon carbide interlayer formed on the metal silicide, and a composite layer of a hard amorphous film and diamond formed on the silicon carbide interlayer. The hard amorphous film is preferably selected from, but not restricted to, a group consisting of diamond-like carbon (DLC), titanium dioxide, titanium nitride, titanium carbide, and related compounds. The diamond of the composite layer preferably comprises diamond crystallites randomly formed on a bottom surface of the composite layer, adjacent to the silicon carbide interlayer.

The diamond composite film consisting of dispersed diamond particles and a hard amorphous film offers an ideal protective coating for metal substrates, particularly against extremely harsh environments. The composite film achieves thermal, chemical, and mechanical stability, which is not achieved by diamond or any hard amorphous film in itself. The resulting film is also very smooth, a condition which is not easily achieved by polycrystalline diamond films.

In accordance with an alternative embodiment of the invention, multilayer films are provided to obtain thicker films. A trilayer structure, for example, may be formed which includes three layers of the composite hard amorphous film/diamond layer, each separated by interlayers. In one such embodiment, the trilayer composite film includes, from the metal substrate outward, a first layer consisting of a metal silicide interlayer, a silicon carbide interlayer, and a composite titanium-based hard amorphous film/diamond layer. A second layer of the trilayer composite includes a titanium silicide interlayer formed directly on the titanium-based hard amorphous film of the first layer, a silicon carbide interlayer formed on the titanium silicide, and another combination titanium-based hard amorphous film/diamond layer. A third layer of the trilayer composite is similar to the second layer, and includes a titanium silicide interlayer and a silicon carbide interlayer, but provides a composite layer which includes hard amorphous films such as DLC or titanium-based compounds. The choice of hard amorphous films depends upon the particular application.

The purpose of the interlayers is to provide a strong chemical bond between two materials which are quite different in chemistry and in thermal and mechanical properties. Hence, the interlayer acts as a transition layer with an element common to both materials being linked.

In accordance with another aspect of the invention, a method for forming composite diamond films on a metal substrate is provided. A metal substrate is mounted within an electron cyclotron resonance (ECR) microwave plasma chemical vapor deposition (CVD) chamber. Hydrogen and silane gases are mixed within the chamber at a temperature below 100° C. under ECR conditions whereby a thin film of amorphous silicon forms on the metal substrate. Next, methane and hydrogen gases are mixed in the chamber at a temperature of about 800° C. under ECR conditions whereby diamond crystallites nucleate on the amorphous silicon layer. As the diamond crystallites nucleate, the high temperature in the chamber causes a bottom portion of the amorphous silicon film to react with the metal substrate to form an interlayer of metal silicide. Simultaneously, a top portion of the amorphous silicon layer reacts with the methane to form a silicon carbide interlayer immediately below the diamond crystallites. Finally, a hard amorphous film, preferably consisting of DLC, titanium nitride, titanium dioxide, or titanium carbide is deposited on the diamond crystallites and on exposed portions of the silicon carbide. Titanium tetrachloride is preferably used to form the titanium-based hard amorphous films. The titanium-based film is achieved by mixing titanium tetrachloride and nitrogen, oxygen, or methane within the chamber to form titanium nitride, titanium, dioxide, and titanium carbide, respectively.

Alternatively, the composite structure of the invention can be formed by directly depositing metal silicide onto the metal substrate and subsequently directly depositing silicon carbide onto the metal silicide.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE INVENTION

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide composite diamond film structures formed on metals and to provide methods for forming such composite diamond film structures on metals.

Figure 1:
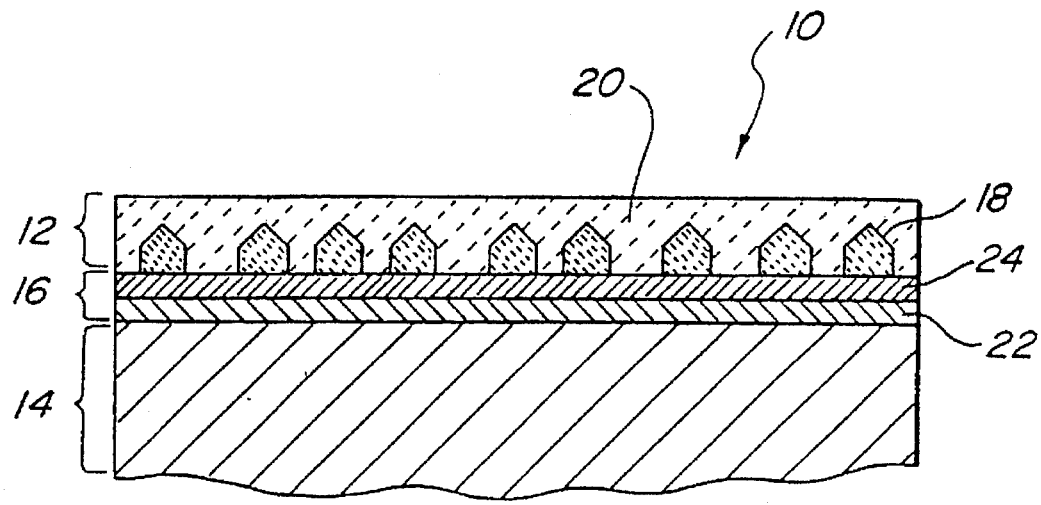
FIG. 1 provides a side cross-sectional view of a composite structure formed on a metal substrate in accordance with a preferred embodiment of the invention.
Figure 2:
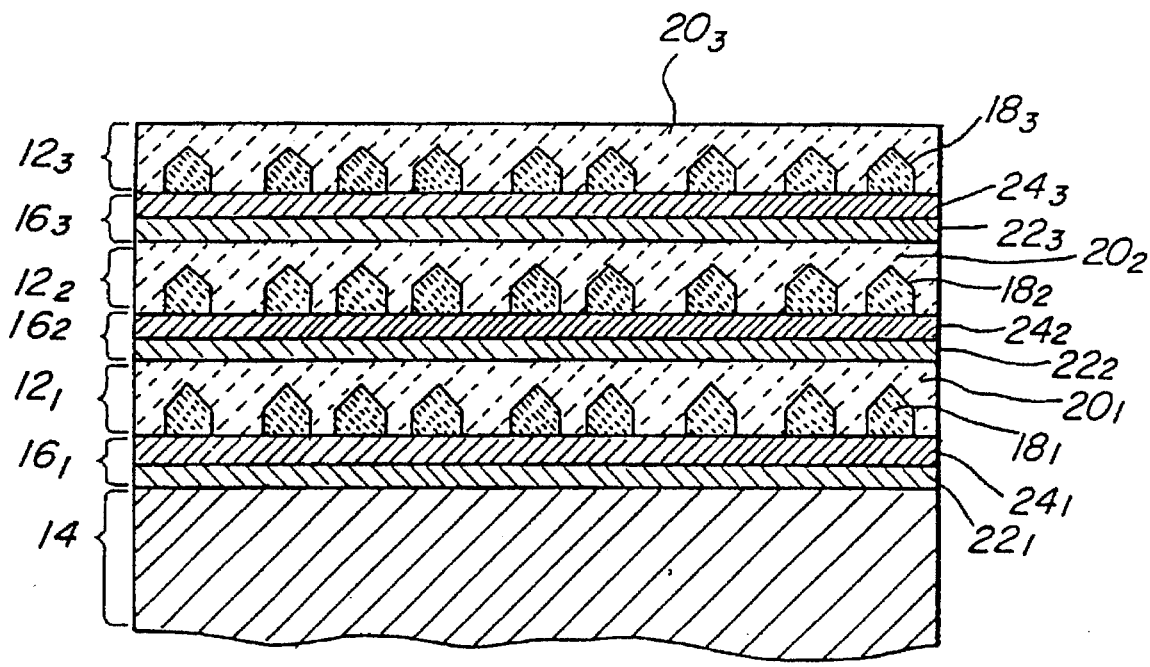
FIG. 2 provides a cross-sectional illustration of a triple-layer composite diamond film structure formed on a metal substrate, in accordance with an alternative embodiment of the invention.

Referring to FIGS. 1 and 2, the preferred embodiments of the invention will now be described. In FIG. 1, a composite film structure 10 is shown in a schematic cross-sectional view and includes a first combination layer 12 having DLC and diamond crystallites formed on a metal substrate 14 via an interlayer 16. Combination layer 12 includes a set of nucleated diamond crystallites 18 randomly dispersed on a top surface of interlayer 16. A hard amorphous DLC film 20 covers the diamond crystallites 18 and any exposed portions of interlayer 16. The DLC layer 20 may alternatively comprise titanium dioxide, titanium nitride, titanium carbide, or related hard amorphous film substances. Metal substrate 14 can comprise any of a number of conventional metals or alloys. A metal silicide layer 22 forms a bottom layer of interlayer 16. A silicon carbide film 24 forms a top portion of interlayer 16. As will be described below, metal silicide layer 22 and silicon carbide film 24 can either be directly deposited onto metal substrate 14, or can be formed from an intermediate amorphous silicon film. If derived from an amorphous silicon film, a quantity of nonreacted and non-transformed amorphous silicon may remain within the interlayer 16. The extent to which the amorphous silicon is converted to either metal silicide or silicon carbide depends upon the thickness of the intermediate amorphous silicon film and the parameters of the deposition method. Preferably, the entire interlayer 16 is formed to a depth of about 200Å.

Thus, the composite film structure of FIG. 1 consists of diamond particles, rather than a continuous diamond film, covered by a layer of hard amorphous DLC, TiN, $TiO_2$, TiC, etc. The size of diamond crystallites 18 ranges from 0.5–10 μm in diameter, depending on the desired final film thickness. The thin interlayer 16 is provided to ensure a good chemical bonding between substrate 14 and overlying film 12. Interlayer 16 also acts as a carbon diffusion barrier and surface catalytic inhibitor. The mechanical hardness of the crystalline diamond particles and the amorphous films contributes to the formation of a hard and wear-resistant surface. The above-mentioned amorphous films are used as an overlayer because of their hardness, unusual smoothness, and pinhole-free microstructures. Furthermore, hard amorphous films are much more flexible than polycrystalline diamond films such that spallation damage does not readily occur if the substrate flexes.

FIG. 2 provides an alternative structural embodiment which includes three combination hard amorphous film and diamond crystallite layers, each formed on an interlayer. More specifically, a first combination hard amorphous film and diamond crystallite layer $12_1$ is formed on a first interlayer $16_1$, which is formed directly on metal substrate 14. Unlike the combination DLC and diamond crystallite layer 12 of the embodiment of FIG. 1, combination layer $12_1$ of FIG. 2 is formed with a titanium-based hard amorphous film, such as titanium dioxide. The titanium-based hard amorphous film is denoted $20_1$ in FIG. 2. Interlayer $16_1$ of FIG. 2 is similar to interlayer 16 of FIG. 1, and includes a top layer of silicon carbide $24_1$ and a bottom layer of metal silicide $22_1$. The diamond crystallites of the first combination layer $12_1$ are denoted by $18_1$. Notably, the top portion of interlayer $16_1$ is composed of silicon carbide, even though the hard amorphous film overlayer is a titanium-based hard amorphous film. As will be explained in greater detail below, the top portion of the interlayer is converted from an intermediate amorphous film into silicon carbide, not because of the presence of carbon in the hard amorphous film, but because of the presence of carbon in the plasma employed to nucleate the diamond crystallites.

A second interlayer $16_2$ is formed on combination layer $12_1$, with a second combination layer $12_2$ formed on interlayer $16_2$. Interlayer $16_2$ comprises a bottom layer $22_2$ of titanium silicide and a top layer $24_2$ of silicon carbide. Metal silicide layer $22_1$ of bottommost interlayer $16_1$ results from a reaction of amorphous silicon with the metal substrate. For interlayer $16_2$, bottom layer $22_2$ is the product of a reaction between an amorphous silicon intermediate layer and the titanium-based hard amorphous film $20_1$. Hence, the bottom portion of the amorphous silicon used to form interlayer $16_2$ is converted to a titanium silicide because it is in contact with a titanium-based compound. Top portion $24_2$ of second interlayer $16_2$ yields a silicon carbide layer due to a reaction with carbon employed in nucleating diamond crystallites $18_2$. The hard amorphous film portion of interlayer $12_2$, denoted $20_2$, is formed of a titanium-based hard amorphous substance. Accordingly, a topmost interlayer $16_3$ includes a bottom portion of titanium silicide $22_3$ and a top portion of silicon carbide $24_3$. Finally, the topmost combination layer $12_3$ includes diamond crystallites $18_3$ and a third hard amorphous film, denoted $20_3$, which is either DLC, TiC, TiN, or $TiO_2$, depending on a specific application.

Hence, in the triple-layer structure of FIG. 2, three combination layers of a titanium-based and/or DLC hard amorphous film and diamond crystallite are provided. The presence of titanium in the hard amorphous films affects the resulting interlayers formed atop the titanium-based films. Any of a number of possible multiple-layer films may be provided in accordance with the invention, including any desired combination of titanium-based and DLC-based hard amorphous films. For example, a triple-layer structure, similar to FIG. 2, could be formed using only titanium-based substances as the compound for the hard amorphous films $20_1$, $20_2$, and $20_3$. Alternatively, each of the hard amorphous film layers could consist of DLC. The multiple-layer structure has the advantage of allowing a thick coating to form without leading to stress-related cracking failures.

As noted, the chemical bondings of the interface between the composite films are silicon carbide or titanium silicide, depending upon the types of amorphous films being used as underlayers or overlayers. The composite films are extremely adherent to metals and can withstand severe vibrations and thermal cyclings without fracture, a property which polycrystalline diamond films alone cannot deliver.

When DLC is used as an outermost amorphous layer, the overall structure is self-lubricating due to the ability of DLC to thermally graphitize, with the basal planes of the graphitic layer parallel to the film surface. Thus, the composite film is useful for tribological coatings, especially to improve the bearing and gear life in advanced rotating machinery. With $TiO_2$ as the overlying film on diamond particles, for example, the coating can be used in highly oxidizing environments at elevated temperatures, an environment in which diamond or DLC cannot be effectively used.

Table I summarizes properties of the composite films of the invention, along with the properties of conventional continuous polycrystalline diamond coatings.

TABLE I

| | MATERIALS | |
|---|---|---|
| PROPERTIES | Diamond Composite | Poly-Diamond |
| Chemically inert | Yes | Yes |
| Mechanically hard | Yes | Yes |
| Adherent | Yes | No |
| Thermally stable | Yes | No |
| Vibration-resistant | Yes | No |
| Pin-holes | No | Yes |
| Usable in highly oxidizing environment at high temperatures | Yes | No |
| Self-lubricating | Yes | No |
| Depositable on transition elements containing materials (Fe, Ni, Co, Pt, etc.) | Yes | No |

An ECR microwave plasma CVD technique has been found to be effective for fabricating the composite films of the present invention.

Figure 3:
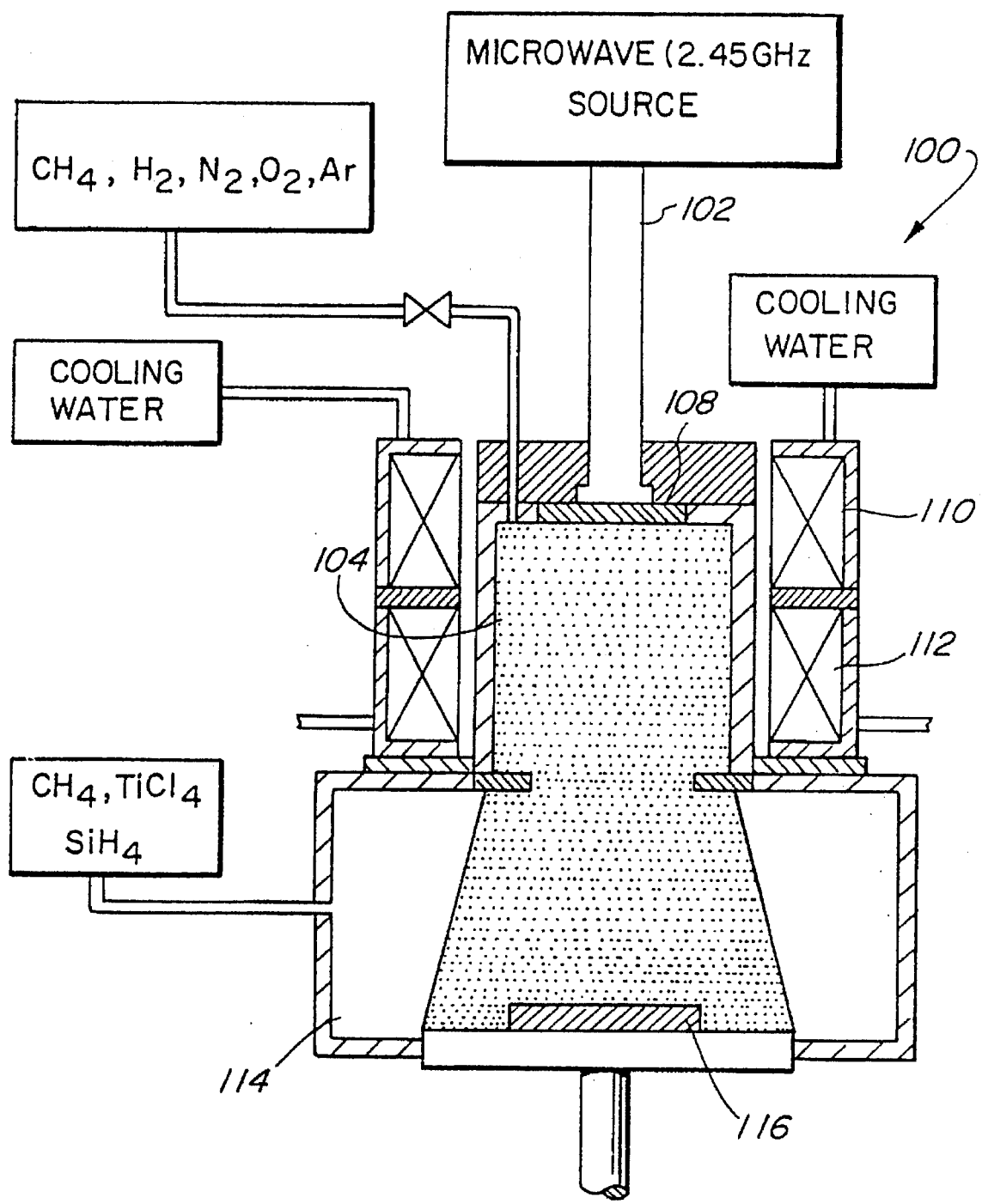
FIG. 3 provides a side cross-sectional view, partially in schematic form, of an ECR microwave CVD chamber for forming composite diamond film structures.

FIG. 3 provides a schematic illustration of an ECR microwave plasma CVD system 100. Microwaves with 2.45 GHz frequency are transmitted in a rectangular waveguide 102 and coupled to a cylindrical plasma chamber 104 via a symmetrical mode coupler (not shown) and a quartz window 108. A top magnetic coil 110 provides an ECR resonant field of 875 Gauss, and a lower magnetic coil 112 sets a divergent magnetic field profile for plasma extraction into a deposition chamber 114. The magnetic field strength is gradually weakened from the ECR condition at the top of plasma chamber 104 to a lower value at a sample stage or substrate 116 in deposition chamber 114. The magnetic moment of resulting electrons in circular motion interacts with the magnetic field gradient. This magnetic interaction accelerates the electrons toward sample stage 116 and induces a negative potential at the sample stage with respect to the plasma chamber. Ions are accelerated by this negative potential toward sample stage 116 and electrons are decelerated to lose the same amount of energy and to satisfy an inherent electrical neutralization condition. As a result, deposition reactions induced by ions are enhanced and heating effects caused by electrons are reduced.

System 100 can be operated both in high and low pressure regimes, as well as in ECR mode, to deposit high quality films (diamond, DLC, $TiO_2$, a-Si:H, etc.) over a large and complicated structure uniformly. The deposition system is capable of fabricating various advanced thin films all in a single chamber without any need to break vacuum. High pressure microwave plasma CVD has reliably produced high quality polycrystalline diamond. The typical deposition conditions for polycrystalline diamond are: pressure=30–100 Torr; temperature=$800°$–$1000°$ C.; $CH_4/H_2$=0.5–1%. However, the plasma formed under high pressure conditions is highly localized. The ECR microwave plasmas utilized by the invention generally provide a much larger deposition area than conventional polycrystalline techniques. Low gas pressures ($10^{-5}$ to $10^{-3}$ Torr), high plasma density ($10^{11}$/$cm^3$), and high ionization ratio (0.01) are the important characteristics of the ECR plasmas. These features provide a very desirable processing condition for modifying film growth kinetics and for enhancing surface reactions to promote film growth at lower substrate temperatures.

Figure 4:
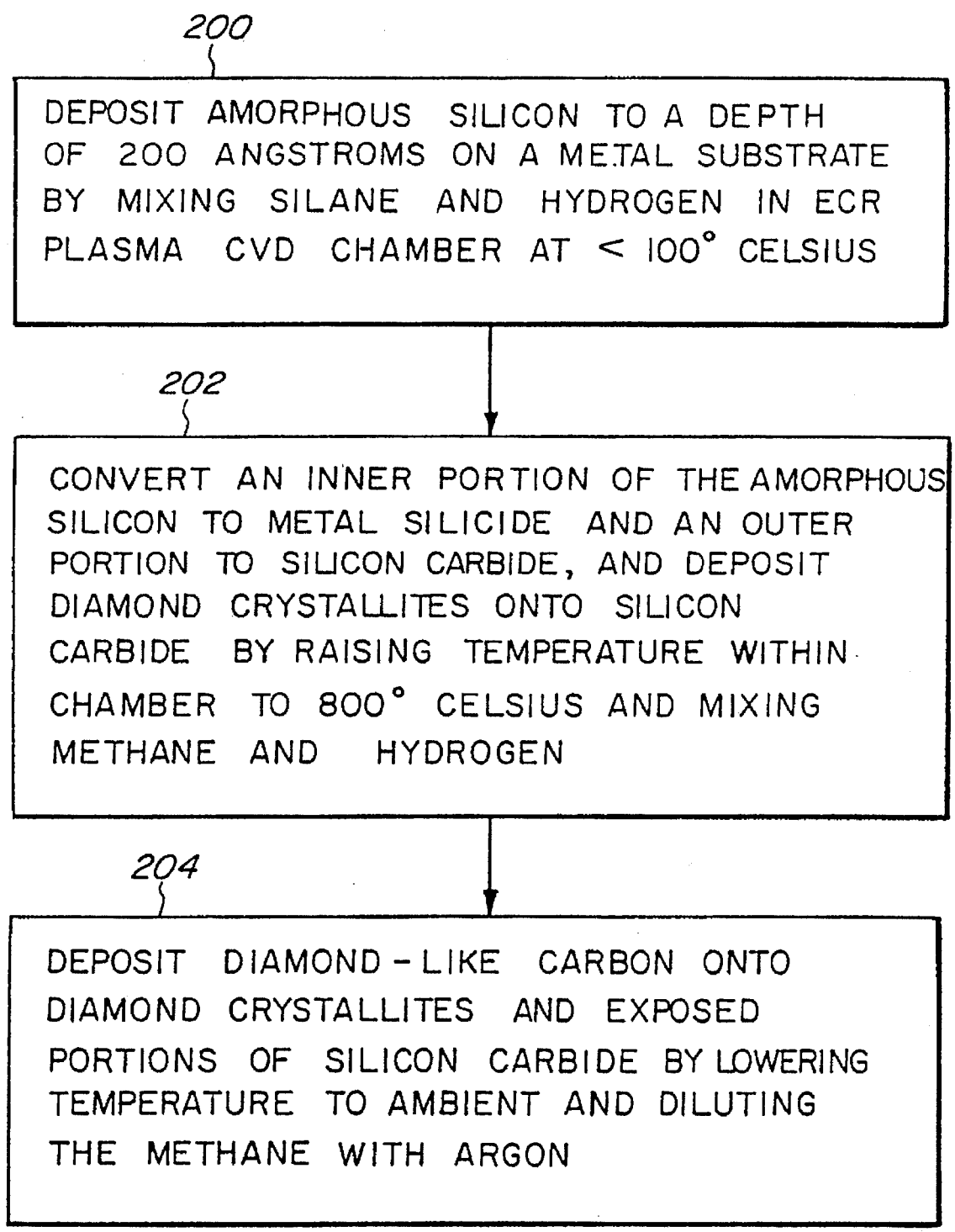
FIG. 4 provides a block diagram illustrating a preferred method for forming the composite film structure of FIG. 1.
Figure 5:
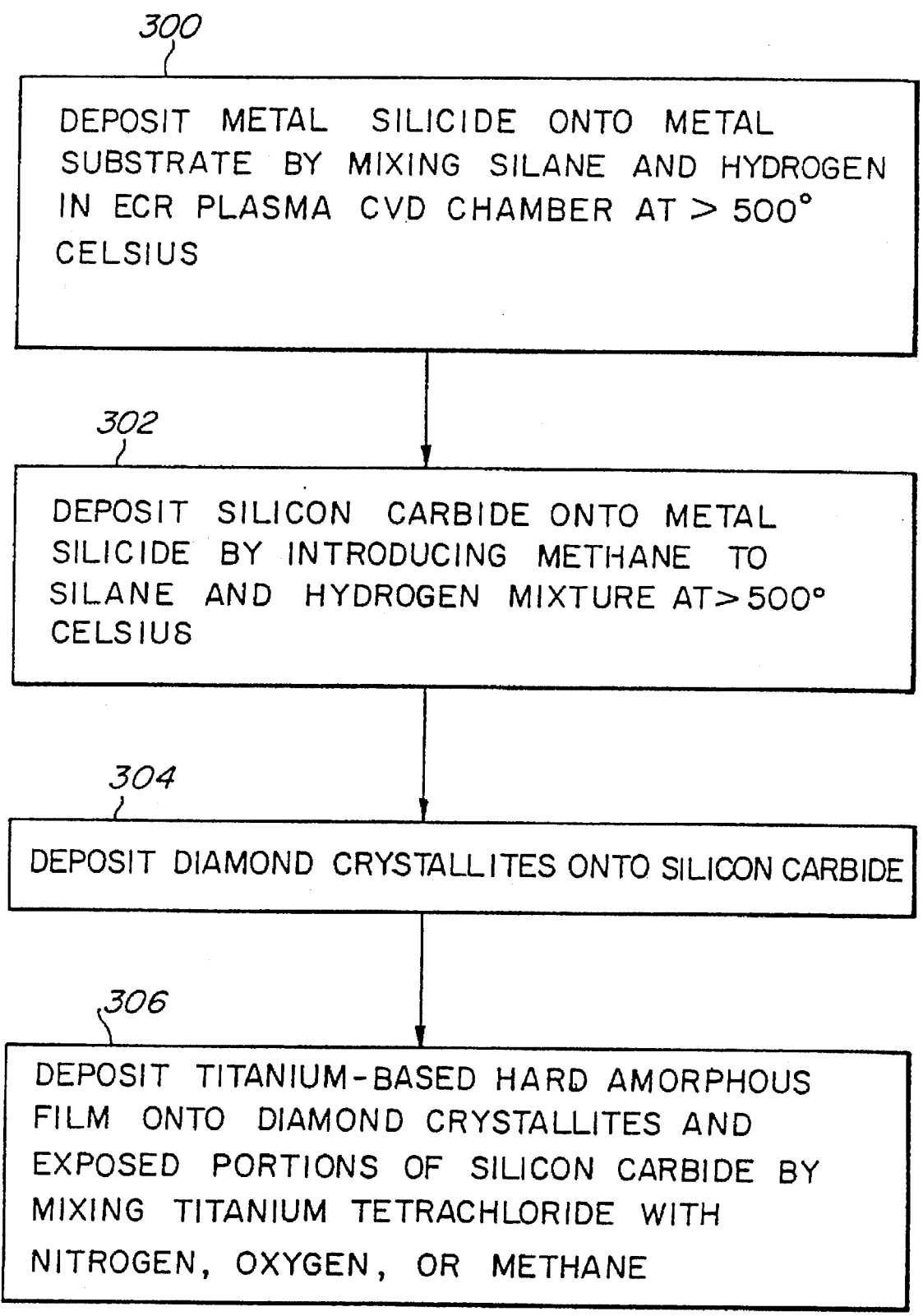
FIG. 5 provides a block diagram illustrating an alternative method for forming the composite film structure of FIG. 1.

Referring to FIGS. 4–6, preferred methods for forming the composite films, within an ECR plasma CVD chamber, will now be described. Referring first to FIG. 4, a thin amorphous silicon (~200Å) is deposited, at step 200, by mixing silane ($SiH_4$) with hydrogen at low temperatures (<$100°$ C.) and within a pressure range of 1–200 mTorr. The ratio of $SiH_4$ to $H_2$ is between 0.01–0.2. The silane gas is removed prior to the subsequent step 202.

To deposit the diamond particles in step $20_2$, a mixture of 0.5–2% methane in hydrogen is used at a pressure ~10 Torr or higher and a temperature $800°$ C. At this low pressure condition, a reasonably wide area of deposition can be obtained. In the case of depositing DLC films, a small dilution of methane with argon (~1–2%) at ~1–2 mTorr and ambient temperature is used. The ratio of methane to argon to An gases is at least 20 or higher. An rf bias of −100 V is essential in obtaining the diamond-like properties. During diamond nucleation, the methane and hydrogen gas mixtures react at ~$800°$ C. with the amorphous silicon film, formed at step 200, to form silicon carbide. At the same time, the amorphous silicon also reacts with the metal substrate to give metal silicide.

Finally, at step 204, a hard amorphous film, for example, DLC is deposited after removal of the hydrogen gas. The conditions for depositing polydiamond films are known in this field and will not be repeated herein.

In an alternative deposition method, illustrated in FIG. 5, metal silicide is formed at step 302 by reacting the silane/hydrogen mixture directly with metal substrate at high temperatures (>$500°$ C.). The silane to hydrogen gas ratio is between 0.01–0.02. The pressure range is between 1–200 mTorr. Then, silane/methane/hydrogen gas mixtures are used to directly deposit silicon carbide, at 302. Deposition of diamond crystallites, at 304, is similar to the deposition step 202 of FIG. 4. The pressure range is 10 Torr or higher. The silane gas is removed from the chamber prior to depositing the diamond crystallites. The ratio of methane to argon is also at least 20 or higher.

The temperature of the chamber at step 306 is 300°–500° C. If a titanium-based hard amorphous film is desired, titanium tetrachloride is used to form titanium nitride, titanium dioxide, or titanium carbide by mixing the gas with nitrogen, oxygen, or methane, respectively. The relative ratio of titanium tetrachloride to either nitrogen, oxygen, or methane is between 0.25–2.00, depending on the particular mixture and the desired characteristic of the amorphous film.

The pressure range is 10 Torr or higher, and the silane gas is removed from the chamber prior to depositing the diamond crystallites. The ratio of methane to argon is also at least 20 or higher.

The following equations summarize the deposition methods of FIGS. 4 and 5, respectively:

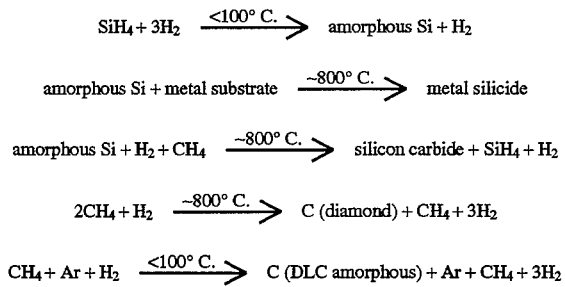

The following equations disclose the depositing of various forms of hard amorphous films in FIG. 5:

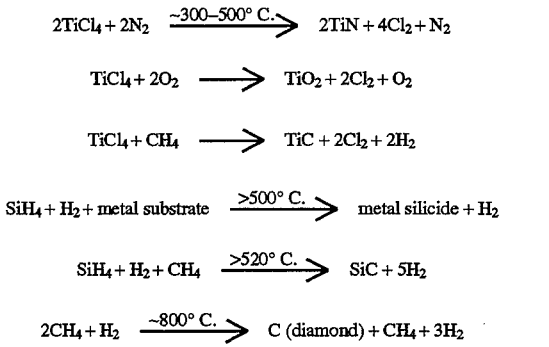

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

We claim:

1. A method for forming a structure of multiple diamond crystallite composites on a metal or carbon substrate within an electron cyclotron resonance microwave plasma chemical vapor deposition chamber, the method comprising:

a first step of reacting the substrate with silane and hydrogen to form a metal silicide on the substrate if the substrate is metal or reacting the substrate with silane, methane and hydrogen to form silicon carbide on the substrate if the substrate is carbon a second step of depositing diamond crystallites onto the metal silicide or silicon carbide layer;

a third step of depositing an amorphous layer onto the diamond crystallites and onto exposed portions of the metal silicide or silicon carbide layer; and repeating the first step through the third step at least one time, each iteration creating one diamond crystallite composite.

2. The method of claim 1, wherein the amorphous layer is selected from the group consisting of amorphous carbon; titanium dioxide; titanium nitride; and titanium carbide.

3. A method for forming a structure of multiple diamond crystallite composites on a metal substrate within an electron cyclotron resonance microwave plasma chemical vapor deposition chamber, the steps of forming the structure comprising:

depositing an amorphous silicon film on a surface of the metal substrate by mixing hydrogen with silane at a temperature less than 100 degrees Celsius within the chamber;

heating the amorphous silicon to 800 degrees Celsius to form an interlayer in a bottom portion of the amorphous silicon film through a chemical reaction of the surface with the silicon film;

forming an interlayer of silicon carbide in a top portion of the amorphous silicon film through a chemical reaction of methane with the silicon film at about 800 degrees Celsius;

nucleating and depositing diamond crystallites on the silicon carbide interlayer by mixing methane and hydrogen at about 800 degrees Celsius;

depositing an amorphous layer of diamond-like carbon, titanium carbide, titanium dioxide pr titanium nitride onto the diamond crystallites and onto exposed portions of the silicon carbide interlayer; and repeating the above steps at least one time, each iteration creating one diamond crystallite composite.

4. The method of claim 3, wherein the amorphous layer is selected from the group consisting of amorphous carbon; titanium dioxide; titanium nitride; and titanium carbide.

* * * * *